United States Patent
Liu et al.

(10) Patent No.: US 11,637,166 B2
(45) Date of Patent: Apr. 25, 2023

(54) ARRAY SUBSTRATE, MANUFACTURING METHOD THEREOF, AND DISPLAY APPARATUS

(71) Applicant: BOE TECHNOLOGY GROUP CO., LTD., Beijing (CN)

(72) Inventors: Yingwei Liu, Beijing (CN); Qi Yao, Beijing (CN); Ke Wang, Beijing (CN); Zhanfeng Cao, Beijing (CN); Zhiwei Liang, Beijing (CN); Muxin Di, Beijing (CN); Guangcai Yuan, Beijing (CN); Xue Jiang, Beijing (CN); Dongni Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 472 days.

(21) Appl. No.: 16/651,551

(22) PCT Filed: Nov. 13, 2019

(86) PCT No.: PCT/CN2019/117880
§ 371 (c)(1),
(2) Date: Mar. 27, 2020

(87) PCT Pub. No.: WO2020/207013
PCT Pub. Date: Oct. 15, 2020

(65) Prior Publication Data
US 2020/0328266 A1    Oct. 15, 2020

(30) Foreign Application Priority Data
Apr. 12, 2019    (CN) .......................... 201910293890.2

(51) Int. Cl.
*H01L 27/32*    (2006.01)
*H01L 51/56*    (2006.01)
*H01L 51/00*    (2006.01)

(52) U.S. Cl.
CPC ........ *H01L 27/3276* (2013.01); *H01L 27/326* (2013.01); *H01L 51/0097* (2013.01);
(Continued)

(58) Field of Classification Search
CPC .................................................. H01L 27/3276
See application file for complete search history.

(56) References Cited

U.S. PATENT DOCUMENTS

| 2010/0103635 A1* | 4/2010 | Tuominen | ............. | H01L 23/552 |
| | | | | 361/764 |
| 2012/0247814 A1* | 10/2012 | Shimizu | ............. | H01L 21/4857 |
| | | | | 174/257 |

(Continued)

FOREIGN PATENT DOCUMENTS

| CN | 105789225 A | 7/2016 |
| CN | 107256870 A | 10/2017 |

(Continued)

OTHER PUBLICATIONS

International Search Report dated Jan. 23, 2020, issued in counterpart application No. PCT/CN2019/117880. (13 pages).

(Continued)

*Primary Examiner* — Douglas M Menz
(74) *Attorney, Agent, or Firm* — WHDA, LLP

(57) ABSTRACT

The present disclosure relates to a method of manufacturing an array substrate. The method of manufacturing an array substrate may include forming a main via hole in a substrate, filling a first conductive material in the main via hole, and forming a pixel circuit layer on a first surface of the substrate. The pixel circuit layer may include a first via hole. An orthographic projection of the first via hole on the substrate may at least partially overlap the corresponding main via hole.

18 Claims, 7 Drawing Sheets

(52) U.S. Cl.
CPC ........ *H01L 51/56* (2013.01); *H01L 2227/323* (2013.01); *H01L 2251/305* (2013.01); *H01L 2251/5338* (2013.01)

(56) References Cited

U.S. PATENT DOCUMENTS

| | | | |
|---|---|---|---|
| 2015/0021081 A1* | 1/2015 | Mitarai | H01L 23/15 29/846 |
| 2015/0028343 A1* | 1/2015 | Li | G02B 5/20 438/158 |
| 2016/0351650 A1 | 12/2016 | Chang | |
| 2019/0363155 A1* | 11/2019 | Xiao | H01L 27/1218 |
| 2021/0066438 A1* | 3/2021 | Liu | G09G 3/3216 |

FOREIGN PATENT DOCUMENTS

| | | |
|---|---|---|
| CN | 109244086 A | 1/2019 |
| CN | 109786391 A | 5/2019 |
| CN | 110010627 A | 7/2019 |

OTHER PUBLICATIONS

Office Action dated May 8, 2020, issued in counterpart CN application No. 201910293890.2, with English translation. (12 pages).

* cited by examiner

ARRAY SUBSTRATE, MANUFACTURING METHOD THEREOF, AND DISPLAY APPARATUS

CROSS-REFERENCE TO RELATED APPLICATIONS

This application claims benefit of the filing date of Chinese Patent Application No. 201910293890.2 filed on Apr. 12, 2019, the disclosure of which is hereby incorporated in its entirety by reference.

TECHNICAL FIELD

The present disclosure relates to the field of display technologies, and in particular, to an array substrate, a manufacturing method thereof, and a display apparatus.

BACKGROUND

With the continuous advancement of microelectronic technology, the feature size of integrated circuits continues to shrink, the interconnection density continues to increase, and the requirements for display panels are constantly increasing.

BRIEF SUMMARY

An embodiment of the present disclosure provides a method of manufacturing an array substrate. The method of manufacturing an allay substrate may include forming a main via hole in a substrate, filling a first conductive material in the main via hole, and forming a pixel circuit layer on a first surface of the substrate. The pixel circuit layer may include a first via hole. An orthographic projection of the first via hole on the substrate may at least partially overlap the corresponding main via hole.

Optionally the pixel circuit layer comprising a pixel circuit; and the method further comprising filling a second conductive material in the first via hole, the second conductive material being electrically connected to the pixel circuit.

Optionally, the method of manufacturing an array substrate further includes forming a connecting circuit layer and a protection layer covering the connecting circuit layer on a second surface of the substrate opposite from the first surface; the connecting circuit layer and the protective layer comprising a second via hole corresponding to the main via hole, the second via hole penetrating through the connecting circuit layer and the protective layer, and an orthographic projection of the second via hole on the substrate at least partially overlapping the corresponding main via hole; wherein the second via hole exposes a terminal located on a side of the connecting circuit layer.

Optionally, the method of manufacturing an array substrate further includes filling a third conductive material in the second via hole, wherein the third conductive material is electrically connected to the connecting circuit layer through the terminal on the side of the connecting circuit layer.

Optionally, the method of manufacturing an array substrate further includes forming a third via hole in the protective layer, wherein an orthographic projection of the third via hole on the substrate at least partially overlaps an orthographic projection of the connecting circuit layer on the substrate.

Optionally, the connecting circuit layer including a source driving circuit and a gate driving circuit; and the method further includes filling an oxide conductive material in the third via hole, and forming a driving circuit layer on a side of the protective layer opposite from the connecting circuit layer, wherein the driving circuit layer is configured to provide a display signal and a timing control signal to the source driving circuit and the gate driving circuit through the oxide conductive material, respectively.

Optionally, the orthographic projection of the first via hole on the substrate completely coincides with the corresponding main via hole; or the orthographic projection of the first via hole on the substrate completely covers the corresponding main via hole, and an area of the orthographic projection of the first via hole on the substrate is larger than an area of a cross section of the main via hole; or the corresponding main via hole completely covers the orthographic projection of the first via hole on the substrate, and the area of a cross section of the main via hole is larger than the area of the orthographic projection of the first via hole on the substrate.

Optionally, the first via hole is formed in a multilayer structure of the pixel circuit layer through a mask; or, the first via hole is formed while forming each layer structure in the pixel circuit layer, and finally a plurality of via holes in the multilayer structure overlap to form the first via hole.

Optionally, the second conductive material is filled in the first via hole by a dispensing or electroless plating process, and the third conductive material is filled in the second via hole by a dispensing or electroless plating process.

One embodiment of the present disclosure includes an array substrate, comprising a substrate, comprising a main via hole, the main via hole filled with a first conductive material; a pixel circuit layer on a first surface of the substrate, the pixel circuit layer comprising a first via hole corresponding to the main via hole, an orthographic projection of the first via hole on the substrate at least partially overlapping the corresponding main via hole, and the first via hole filled with a second conductive material; wherein the pixel circuit layer comprises a pixel circuit electrically connected to the first conductive material through the second conductive material in the first via hole.

Optionally, the array substrate further includes a connecting circuit layer and a protective layer covering the connecting circuit layer on a second surface opposite from the first surface of the substrate; the connecting circuit layer and the protective layer comprising a second via hole corresponding to the main via hole, the second via hole penetrating through the connecting circuit layer and the protective layer, and an orthographic projection of the second via hole on the substrate at least partially overlapping the corresponding main via hole; wherein the second via hole exposes a terminal on a side of the connecting circuit layer, and the second via hole is filled with a third conductive material, and the terminal on the side of the connecting circuit layer is electrically connected to the first conductive material through the third conductive material.

Optionally, the array substrate comprises a display area and a peripheral area at a periphery of the display area; the main via hole is located in the peripheral area, and the connecting circuit layer is located at least partially in the display area.

Optionally, the protective layer further comprises a third via hole, an orthographic projection of the third via hole on the substrate at least partially overlaps an orthographic projection of the connecting circuit layer on the substrate; and the third via hole is filled with an oxide conductive material.

Optionally, the array substrate further comprises a driving circuit layer on a side of the protective layer opposite from the connecting circuit layer, wherein the driving circuit layer is configured to provide a display signal and a timing control signal to a source driving circuit and a gate driving circuit in the connecting circuit layer through the oxide conductive material, respectively.

Optionally, an orthographic projection of the first via hole on the substrate completely coincides with the corresponding main via hole; or the orthographic projection of the first via hole on the substrate completely covers the corresponding main via hole and an area of the orthographic projection of the first via hole on the substrate is larger than an area of a cross section of the main via hole; or the corresponding main via hole completely covers the orthographic projection of the first via hole on the substrate, and the area of a cross section of the main via hole is larger than the area of the orthographic projection of the first via hole on the substrate.

Optionally, the first conductive material comprises molybdenum, copper, molybdenum-niobium alloy, aluminum; or Indium tin oxide.

Optionally, the second conductive material and the third conductive material each are one of silver paste, copper paste or solder paste.

Optionally, the substrate is a rigid substrate or a flexible substrate.

One embodiment of the present disclosure is a display panel comprising the array substrate according to one embodiment of the present disclosure.

One embodiment of the present disclosure is a display apparatus comprising the display panel of according to one embodiment of the present disclosure.

BRIEF DESCRIPTION OF THE DRAWINGS

In order to more clearly illustrate the embodiments of the present disclosure or the technical solutions in the prior art. the drawings used in the embodiments or the prior art description will be briefly described below. Obviously, the drawings in the following description are only some embodiments of the present disclosure, and those skilled in the art can obtain other drawings according to the drawings without any creative work.

DETAILED DESCRIPTION

The technical solutions in the embodiments of the present disclosure are clearly and completely described in the following with reference to the accompanying drawings in the embodiments of the present disclosure. It is obvious that the described embodiments are only a part of the embodiments of the present disclosure, but not all embodiments. All other embodiments obtained by a person of ordinary skill in the art based on the embodiments of the present disclosure without creative efforts are within the scope of the present disclosure.

In addition, the terms "first" and "second" etc. are for illustration purposes only and are not to be construed as indicating or implying relative importance or implied reference to the quantity of indicated technical features. Thus, features defined by the terms "first" and "second" etc. may explicitly or implicitly include one or more of the features. In the description of the present disclosure, the meaning of "plural" is two or more unless otherwise specifically and specifically defined.

In the description of the specification, references made to the term "some embodiment," "some embodiments," and "exemplary embodiments, " "example," and "specific example" or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples.

A numerical value modified by "about" herein means that the value can vary by 10% thereof.

The display apparatus can be used as a mobile phone, a tablet computer, a personal digital assistant (PDA), a vehicle-mounted computer, etc., and the specific use of the display panel is not particularly limited in the embodiment of the present disclosure.

Figure 1:
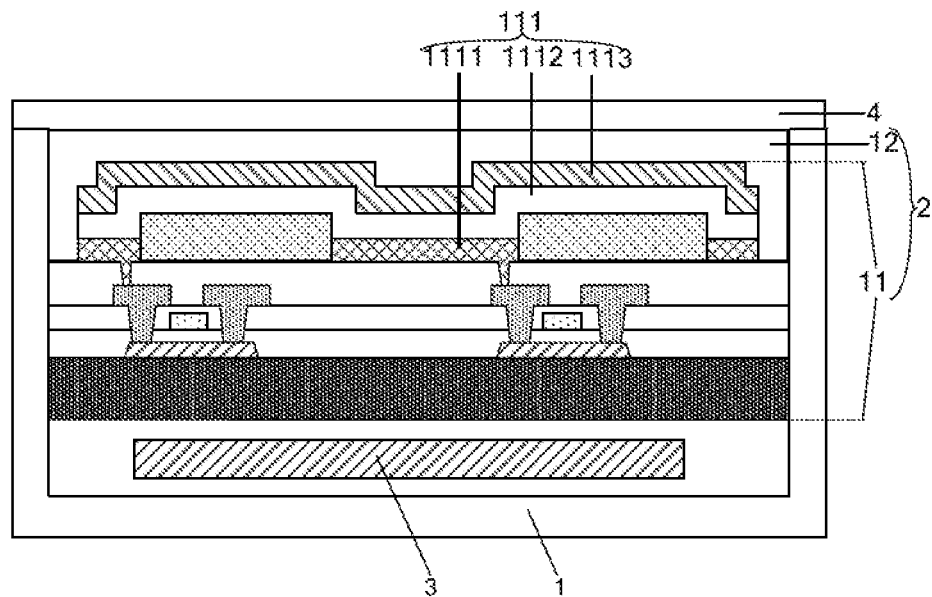
FIG. 1 is a schematic structural diagram of a display apparatus according to an embodiment of the present disclosure.
Figure 2:
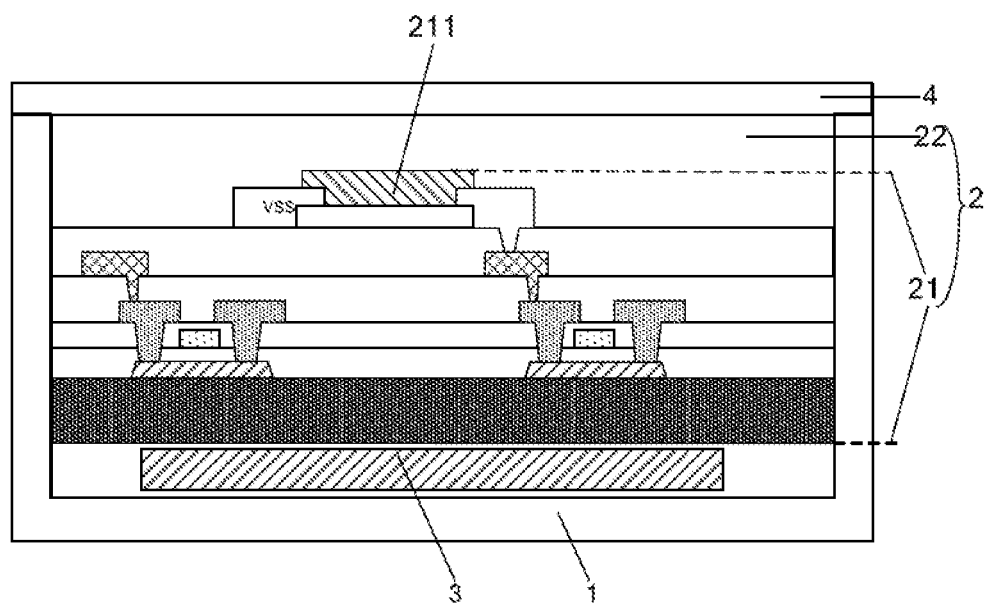
FIG. 2 is a schematic structural diagram of a display apparatus according to an embodiment of the present disclosure.

As shown in FIGS. 1 and 2, the display apparatus may include, for example, a frame 1, a display panel 2, a circuit hoard 3, a cover 4, and other electronic accessories including a camera or the like.

The display panel can be an organic light emitting diode (PLED) display panel or a light emitting diode (LED) display panel.

Taking an OLED display panel as an example (FIG. 1 only shows a top-emitting OLED display panel), as shown in FIG. 1, the OLED display panel includes an array substrate 11 and a package layer 12.

Taking the LED display panel as an example, as shown in FIG. 2, the LED display panel includes an array substrate 21 and an opposing substrate 22.

One embodiment of the present disclosure provides a method for manufacturing an array substrate. The away substrate fabricated by the manufacturing method can be used as the array substrate 11 of the OLED display panel or the array substrate 21 of the LED display panel. Of course, the array substrate produced by the manufacturing method can also be used as an array substrate of other types of display panels as long as the normal display of the display panel is not affected.

Figure 4:
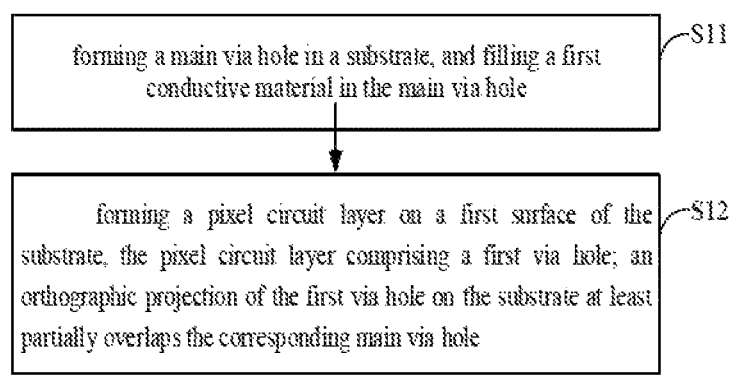
FIG. 4 is a flow chart of manufacturing an array substrate according to an embodiment of the present disclosure.
Figure 5:
FIG. 5 is a schematic diagram of a process of manufacturing an array substrate according to an embodiment of the present disclosure.
Figure 6:
FIG. 6 is a schematic diagram of a method of manufacturing an array substrate according to an embodiment of the present disclosure.

As shown in FIG. 4, the method for manufacturing the array substrate can be produced by the following steps:

In step S11, as shown in FIG. 5, a main via hole 301 is formed in the substrate 30. As shown in FIG. 6, a first conductive material 302 is filled in the main via hole 301.

Optionally, the substrate 30 may be a rigid substrate or a flexible substrate.

When the substrate 30 is a rigid substrate, the material thereof may be, for example, glass.

Optionally, the substrate 30 is a rigid substrate, the substrate 30 my be fixed on the base, and the process of forming the main via hole 301, the process of filling the first conductive material 302 into the main via hole 301, and the subsequent process of forming a pixel circuit layer 31 on the first surface of the substrate 30 may be completed on the base.

Wherein, the base can include a plurality of brackets, and the substrate 30 can be fixed to the base by the plurality of brackets.

Optionally, if the substrate 30 is a flexible substrate, a side of the substrate 30 opposite from the first surface is further provided with a first carrier substrate, and the substrate 30 is fixed on the first carrier substrate. The process of forming the main via hole 301, the process of filling the first conductive material 302 into the main via hole 301, and the subsequent process of forming the pixel circuit layer 31 on the first surface of the substrate 30 are then completed.

Optionally, the process of forming the rain via holes 301 is not limited, and is specifically related to the material of the substrate 30.

For example, if the material of the substrate 30 includes a photosensitive material, the main via hole 301 can be formed directly by exposure and development.

In one embodiment, the substrate 30 comprises a photosensitive material, an insulating film may be formed first; then, a photoresist is formed on the insulating film, and the photoresist is exposed and developed to form a photoresist pattern; and the insulating film is etched to form the substrate 30 having the main via hole 301.

When the substrate 30 is a flexible substrate, the material thereof may be, for example, Polyimide (PI).

The shape of the main via hole 301 is not limited. Optionally, the shape of the main via hole 301 may be a circle, an ellipse, a rectangle, or the like.

Here, the shape of the main via hole 301 refers to a shape of a cross section of the main via hole 301 in a plane perpendicular to the thickness of the base 30.

The number of main via holes 301 is not limited, and the number of main via holes 301 is related to actual demand. Optionally, the number of the main via holes 301 may be one or plural.

The specific material of the first conductive material 302 is not limited.

Optionally, the first conductive material 302 comprises a metal material such as molybdenum (Mo), copper (Cu), molybdenum-niobium alloy (MoNb), aluminum (Al); or the first conductive material 302 may also include an oxide conductive material such as Indium tin oxide (ITO).

The installation position of the main via hole 301 is not limited, which is based on actual needs.

Figure 3:
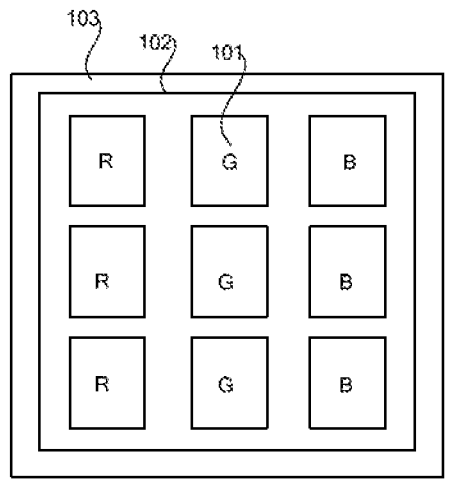
FIG. 3 is a schematic top view of a display apparatus according to an embodiment of the present disclosure.

As shown in FIG. 3, the array substrate includes a display area 102 and a peripheral area 101 located at the periphery of the display area 102. Optionally, the main via hole 301 may be disposed in the display area 102 of the array substrate. Alternatively, the main via holes 301 may be provided in the peripheral area 103 of the array substrate.

Figure 7:
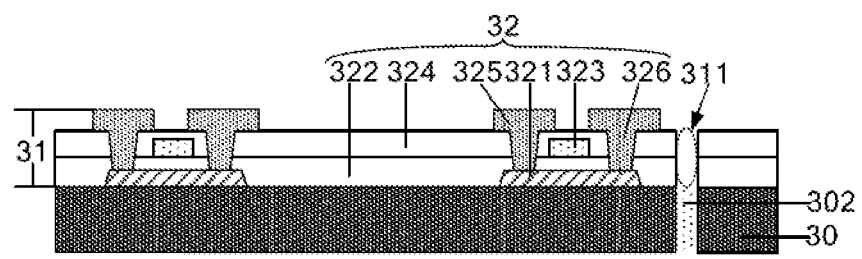
FIG. 7 is a schematic diagram of a method of manufacturing an array substrate according to an embodiment of the present disclosure.

In step S12, as shown in FIG. 7, a pixel circuit layer 31 is formed on the first surface of the substrate 30. The pixel circuit layer 31 has a first via hole 311 corresponding to the main via hole 301. The orthographic projection of the first via hole 311 on the substrate 30 at least partially overlaps the corresponding main via hole 301.

Here, the pixel circuit layer includes a pixel circuit. The pixel circuit includes at least a switching transistor, a driving transistor connected to the light emitting component (including an OLED component or a LED), a storage capacitor, a data line for inputting a data signal to the switching transistor, a gate line for inputting a scanning signal to the switching transistor, and the like. Wherein, the gate line and the data line are insulated from each other.

Optionally, the switching transistor and the driving transistor may be any one of a top gate thin film transistor, a bottom gate thin film transistor, or a double gate thin film transistor.

Taking the top gate thin film transistor 32 as an example, as shown in FIG. 7, the top gate type thin film transistor includes an active layer 321, a gate insulating layer 322, a gate electrode 323, and an interlayer insulating layer 324 which are sequentially disposed on the substrate 30, and a drain 325 and a source 326 disposed on a side of the interlayer insulating layer 234 opposite from the substrate 30. The drain 325 and the source 326 are disposed in the same layer.

The pixel circuit layer 31 includes a multilayer structure. When forming the first via hole 311, optionally; the first via hole 311 may be formed in the multilayer structure of the pixel circuit layer 31 through a mask; Alternatively, a via hole is formed while forming each layer structure in the pixel circuit layer 31, and finally a plurality of via holes in the multilayer structure overlap to form the first via hole 311.

Optionally, the orthographic projection of the first via hole 311 on the substrate 30 and the corresponding main via hole 301 at least partially overlap with each other. In one embodiment, the orthographic projection of the first via hole 311 on the substrate 30 coincides exactly with the corresponding main via hole 301. In one embodiment, the orthogaphic projection of the first via hole 311 on the substrate 30 covers the corresponding main via hole 301 thereto, and the area thereof is larger than the area of the cross section of the main via hole 301. In one embodiment, the main via hole 301 covers the orthographic projection of the first via hole 311 corresponding thereto on the substrate 30, and the area of the cross section of the main via hole 301 is larger than the area of the orthographic projection of the first via hole 311 on the substrate 30. In one embodiment, a portion of the orthographic projection of the first via hole 311 on the substrate 30 overlaps with a portion of the main via hole 301 corresponding thereto.

The shape of the orthographic projection of the first via hole 311 on the substrate 30 is not limited. Optionally, the shape of the orthographic projection of the first via hole 311 on the substrate 30 may be circular, elliptical, rectangular, or the like.

Here, the shape of the orthographic projection of the first via hole 311 on the substrate 30 may be the same as or different from the shape of the main via hole 301.

Optionally, the size of the first via hole 311 is not limited as long as the size of the first via hole 311 does not affect the normal operation of the pixel circuit in the pixel circuit layer 31.

For example, the first via hole 311 has a size ranging from about 50 μm to about 80 μm.

Wherein, the "size" herein refers to the largest size of the via hole. For example, if the shape of the orthographic projection of the first via hole 311 on the substrate 30 is circular, the diameter of the circle is from about 50 μm to about 80 μm. If the shape of the orthographic projection of the first via hole 311 on the substrate 30 is elliptical, the major axis of the ellipse is from about 50 μm to about 80 μm. If the shape of the orthographic projection of the first via hole 311 on the substrate 30 is a rectangle, the diagonal of the rectangle is from about 50 μm to about 80 μm.

One embodiment of the present disclosure provides a method for manufacturing an array substrate. The first via hole 311 is disposed on the pixel circuit layer 31, and the orthographic projection of the first via hole 311 on the substrate 30 and the main via hole 301 on the substrate 30 at least partially overlap. Subsequently, the pixel circuit (for example, the data line and the gate line in the pixel circuit) in the pixel circuit layer 31 and the structure (for example, a subsequently formed connecting circuit) disposed on the side of the substrate 30 opposite from the pixel circuit layer 31 may be vertically connected in the thickness direction of the substrate 30 by the first conductive material 302. In this way, on the one hand, the space of the array substrate can be saved, for example, the flexible printed circuit (FPC) disposed in the peripheral area of the display panel (on the periphery of the display area) is omitted. When the array substrate is applied to a display apparatus, it is advantageous for the display apparatus (especially the splicing screen) to perform a narrow bezel design. On the other hand, it can also increase the speed of the chip and reduce power consumption. On this basis, since the material of the first conductive material 302 is different from the material of the substrate 30, the thermal expansion coefficients of the two are different. Forming a film that requires high temperature annealing or high temperature deposition on the first surface may cause the first conductive material 302 to thermally expand and protrude from the first surface of the substrate 30. The related art often adopts a method of reducing a line width of the light shielding structures (for example, the source and the drain in the pixel circuit) in the display panel to increase the aperture ratio of the display panel. In this way, in the case where the first conductive material 302 protrudes from the first surface of the substrate 30, the light-shielding structures is easily broken, thereby affecting the display effect of the display panel. In one embodiment of the present disclosure, the first via hole 311 is disposed in the pixel circuit layer 31. Since the region of the first via hole 311 is disposed in the pixel circuit layer 31, no other film layer exists. Therefore, in a region where the orthographic projection of the first via hole 311 on the substrate 30 coincides with the main via hole 301, even if the first conductive material 302 disposed in the main via hole 301 is thermally expanded and protrudes beyond the first surface of the substrate 30, any one layer of the pixel circuit layers 31 may not be broken.

Figure 8:
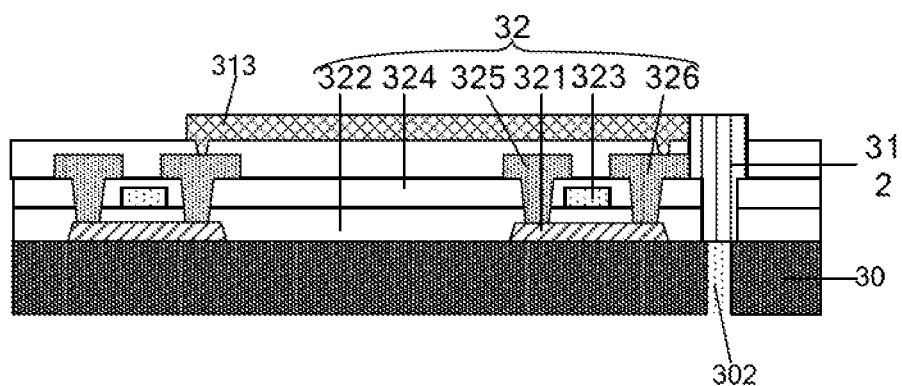
FIG. 8 is a schematic diagram of a method of manufacturing an array substrate according to an embodiment of the present disclosure.

Optionally, as shown in FIG. 8, the pixel circuit layer 31 includes a pixel circuit; the method for manufacturing the array substrate further includes filling a second conductive material 312 in the first via hole 311, and the second conductive material 312 is electrically connected to the pixel circuit.

It will be appreciated by those skilled in the art that the pixel circuit includes a plurality of conductive structures, a portion of the plurality of conductive structures being electrically connected to each other and a portion being insulated from each other.

The second conductive material 312 in one embodiment of the present disclosure is electrically connected to the pixel circuit, and should ensure that the connection relationship of the plurality of conductive structures in the pixel circuit is not affected, thereby avoiding affecting the normal operation of the pixel circuit.

Illustratively, the second conductive material 312 is electrically coupled to the gate line and or data line in the pixel circuit.

The pixel circuit layer 31 may further include a first voltage terminal that inputs the operating voltage VDD to the driving transistor and a second voltage terminal that inputs a wound voltage to the light emitting component. And, the first voltage terminal and/or the second voltage terminal are electrically connected to the second conductive material 312.

Here, the gate line, the data line, the first voltage terminal, and the second voltage terminal are insulated from one another.

The specific material of the second conductive material 312 is not limited. Optionally, the second conductive material 312 may be silver paste, copper paste, solder paste or the like.

In one embodiment of the present disclosure, by filling the second conductive material 312 into the first via hole 311, the pixel circuit in the pixel circuit layer 31 can be electrically connected to the first conductive material 302 through the second conductive material 312. Meanwhile, in a process of forming the pixel circuit layer 31, the process requiring a high temperature such as a high temperature annealing or a high temperature deposition film, the first conductive material 302 may be thermally expanded by the high temperature process and protrudes the first surface. However, since the step of filling the second conductive material 312 is after the formation of the pixel circuit layer 31, the second conductive material 312 can avoid all the high temperature processes in the process of preparing the pixel circuit layer 31, and is formed after the first conductive material 302 is thermally expanded by the high temperature process. Thereby, the second conductive material 312 can be prevented from broken during the thermal expansion process of the first conductive material 102.

Figure 9:
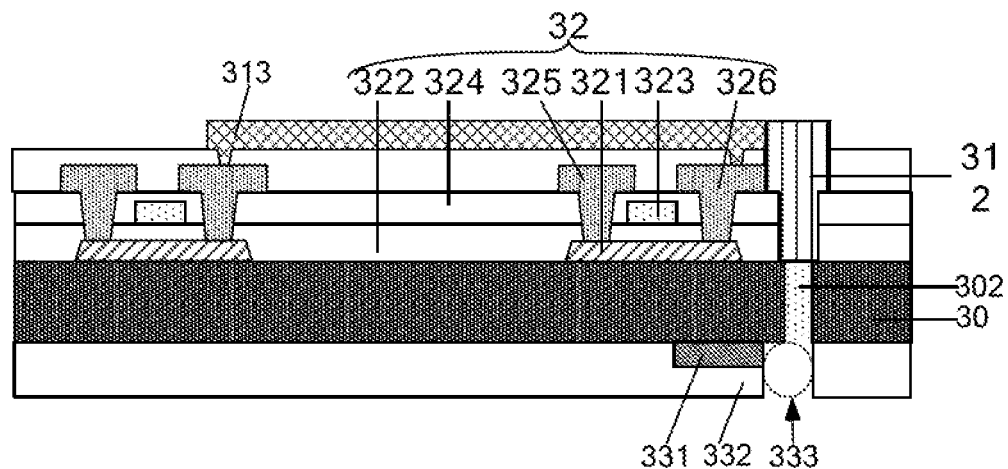
FIG. 9 is a schematic diagram of a method of manufacturing an array substrate according to an embodiment of the present disclosure.

Optionally, as shown in FIG. 9, the method for manufacturing the array substrate further includes: sequentially forming a connecting circuit layer 331 and a protection layer 332 covering the connecting circuit layer 331 on the second surface of the a substrate 30 opposite from the first surface. The connecting circuit layer 331 and the protection layer 332 have a second via hole 333 corresponding to the main via hole 301, and the second via hole 333 penetrates the connecting circuit layer 331 and the protection layer 332. The orthographic projection of the second via hole 333 on the substrate 30 and the corresponding main via hole 301 at least partially overlap. The second via hole 333 exposes a terminal located on a side of the connection circuit layer 331.

Here, in the case where the Gate Driver on Array (GOA) is provided on the array substrate, the connecting circuit layer 331 may include only a source drive circuit. Optionally, the connecting circuit layer 331 may include a gate drive circuit and a source drive circuit.

Optionally, the substrate 30 is a rigid substrate, the substrate 30 can be flipped using the base to expose the second surface of the substrate 30. Thereafter, a process of forming the connecting circuit layer 331 and the protective layer 332 on the second surface of the substrate 30, and subsequently filling the third via hole 333 with the third conductive material 334 are completed.

Optionally, if the substrate 30 is a flexible substrate, a second carrier substrate is disposed on a side of the pixel circuit layer 31 opposite from the second surface; After the second carrier substrate is peeled off a process of forming the connecting circuit layer 331, the protective layer 332 on the second surface of the substrate 30, and subsequently filling the third via hole 333 with the third conductive material 334 are completed.

Optionally, the orthogahic projection of the second via hole 333 on the substrate 30 and the corresponding main via hole 301 at least partially overlap, including: the orthogahic projection of the second via hole 333 on the substrate 30 exactly coincides with the corresponding main via hole 301; alternatively, the orthographic projection of the second via hole 333 on the substrate 30 covers the main via hole 301 corresponding thereto, and the area thereof is larger than the area of the cross section of the main via hole 301; alternatively, the main via hole 301 covers the orthographic projection of the second via hole 333 corresponding thereto on the substrate 30, and the area of the cross section of the main via hole 301 is larger than the area of the orthographic projection of the second via hole 333 on the substrate 30; and alternatively, a portion of the orthographic projection of the second via hole 333 on the substrate 30 coincides with a portion of the main via hole 301 corresponding thereto.

The shape of the orthographic projection of the second via hole 333 on the substrate 30 is not defined. Optionally, the shape of the orthographic projection of the second via hole 333 on the substrate 30 may be a circle, an ellipse, a rectangle, or the like.

Here, the shape of the orthographic projection of the second via hole 333 on the substrate 30 may be the same as or different from the shape of the main via hole 301.

Optionally, the size of the second via hole 333 is not limited.

For example, the second via hole 333 has a size ranging from about 50 µm to about 80 µm.

Wherein, herein the "size" refers to the largest size of the hole. For example, if the shape of the orthographic projection of the second via hole 333 on the substrate 30 is circular, the diameter of the circle is about 50 µm to about 80 µm. If the shape of the orthographic projection of the second via hole 333 on the substrate 30 is elliptical, the major axis of the ellipse is about 50 µm to about 80 µm. If the shape of the orthographic projection of the second via hole 333 on the substrate 30 is a rectangle, the diagonal of the rectangle is about 50 µm to about 80 µm.

In one embodiment of the present disclosure, the connecting circuit layer 331 and the protection layer 332 are formed on the second surface of the substrate 30, the connecting circuit layer 331 and the protective layer 332 have a second via hole 333 extending there through, the second via 333 exposes the terminal located on the side of the connecting circuit layer 331. As such, the second via hole 333 is subsequently filled with a conductive material, and the terminal exposed in the circuit of the connecting circuit layer 331 through the second via hole 333 is connected to the pixel circuit provided in the pixel circuit layer 31 on the first surface. At the same time, since the connecting circuit layer 331 includes metal wires, and the metal material of the metal wires is easily oxidized. Therefore, the protective layer 332 covering the connecting circuit layer 331 can be disposed on the side of the connecting circuit layer 331 opposite from the substrate 30, so that the connecting circuit layer 331 is protected.

Figure 10:
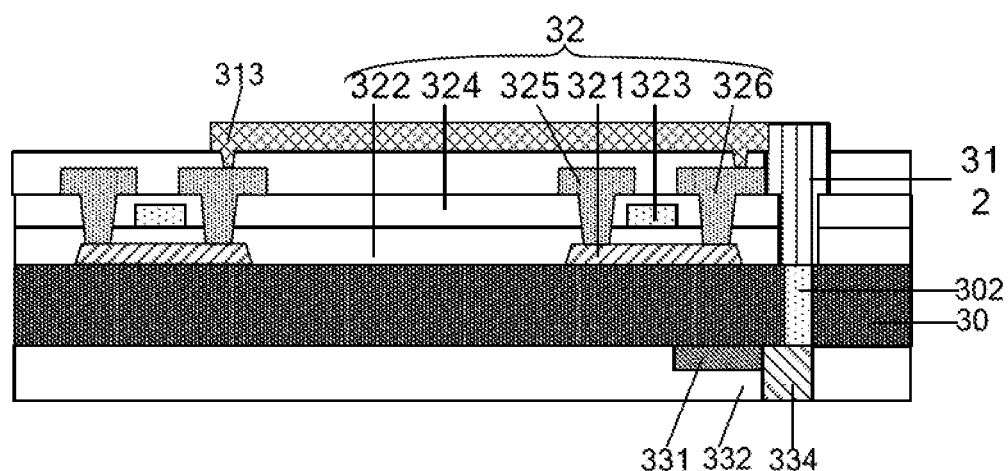
FIG. 10 is a schematic diagram of a method of manufacturing an array substrate according to an embodiment of the present disclosure.

Optionally, as shown in FIG. 10, the method for manufacturing the array substrate further includes: filling a third conductive material 334 into the second via hole 333, and the third conductive material 334 is electrically connected to the connecting circuit layer 31 through the terminal in the connecting circuit layer 331.

It will be understood by those skilled in the art that in the case where the connecting circuit layer 331 includes a plurality of terminals, the timings of the signals output through the plurality of terminals or the output signals are different.

The third conductive material 334 in the embodiment of the present disclosure should be electrically connected to the terminal in the connecting circuit layer 331 while avoiding electrical connection among the plurality of terminals due to the third conductive material 334.

Optionally, the material of the third conductive material 334 may be silver paste, copper paste, and/or solder paste.

In one embodiment of the present disclosure, the third conductive material 334. is filled into the second via hole 333, and the terminal exposed by the third conductive material 334 through the second via hole 333 is electrically connected to the connecting circuit layer 331. The connecting circuit layer 331 is electrically connected to the pixel circuit in the pixel circuit layer 31 through the third conductive material 334, the first conductive material 302, and the second conductive material 312, thereby driving the pixel circuit layer 31 to operate by the connecting circuit layer 331.

On the basis of the above, as shown in FIG. 1 and FIG. 3, if the array substrate prepared by the method for manufacturing the array substrate is used as array substrate 11 of an OLED display panel, and the array substrate 11 of the OLED display panel further has a plurality of sub-pixel regions 101. The array substrate 11 of the OLED display panel includes an OLED component 111 located in each sub-pixel region 101, and the OLED component 111 includes a first electrode 1111, a light-emitting function layer 1112, and a second electrode 1113 which are sequentially stacked on the substrate. The first electrode 1111 is an anode, and the second electrode 1113 is a cathode; or the first electrode 1111 is a cathode, and the second electrode 1113 is an anode. Further, the array substrate 11 of the OLED display panel further includes a pixel circuit for driving the OLED component 111 to emit light.

The pixel circuit is configured to input different voltages to the first electrode 1111 and the second electrode 1113, respectively, thereby forming an electric field between the first electrode 1111 and the second electrode 1113. Under the driving of the electric field, the light-emitting function layer 1112 is injected with carriers, and electrons and holes combined to form excitors, thereby irradiating to form a phenomenon of light emission.

As shown in FIG. 2 and FIG. 3, if the array substrate formed by the method for manufacturing the array substrate is used as the array substrate 21 of the LED display panel, the array substrate 21 of the LED display panel further has a plurality of sub-pixel regions 101. The array substrate 21 of the LED display panel includes LED 211 located in each of the sub-pixel regions 101. Further, the array substrate 21 of the LED display panel further includes a pixel circuit for driving the LED 211 to emit light.

The pixel circuit is for supplying different voltages to the positive and negative electrodes of the LED 211, respectively, to cause the LED 211 to emit light.

Wherein, the LED 211 can emit monochromatic light; or the LED 211 can directly emit three primary colors of light.

Figure 12:
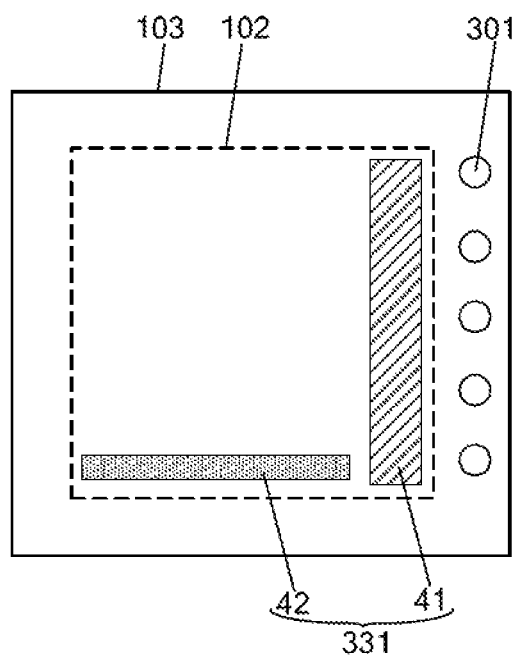
FIG. 12 is a schematic top view of a display apparatus according to an embodiment of the present disclosure.
Figure 13:
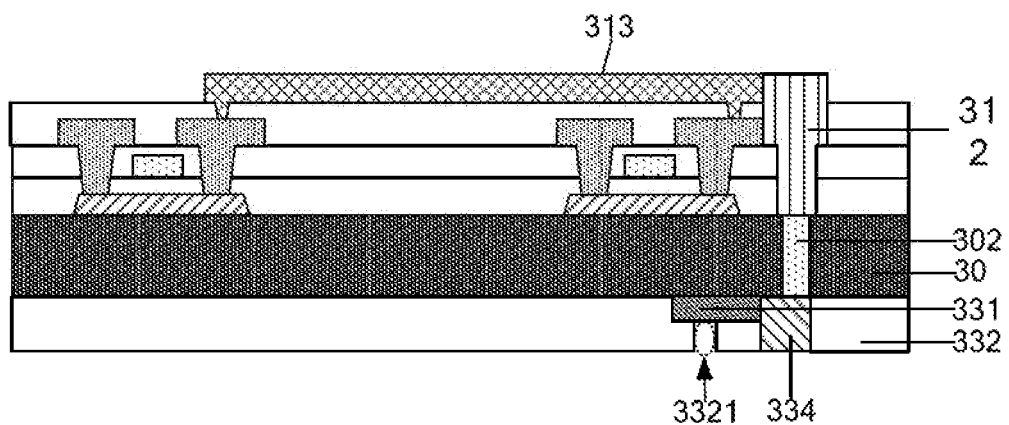
FIG. 13 is a schematic diagram of a method of manufacturing an array substrate according to an embodiment of the present disclosure.
Figure 14:
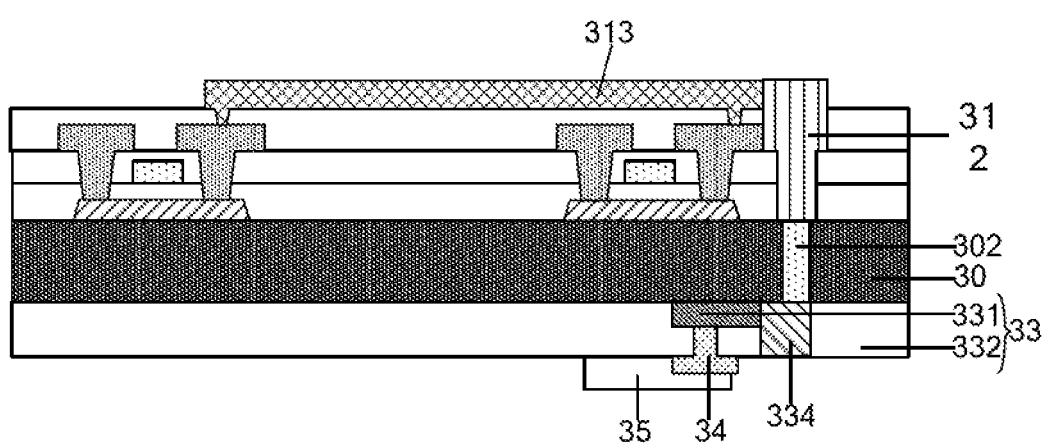
FIG. 14 is a diagram of a method of manufacturing an array substrate according to an embodiment of the present disclosure.

Optionally, as shown in FIG. 13, the protective layer 332 further has a third via hole 3321, and the orthographic projection of the third via hole 3321 on the substrate 30 at least partially overlaps the orthogaphic projection of the connecting circuit layer 31 on the substrate 30; As shown in FIG. 12, the connecting circuit layer 331 includes a source driving circuit 41 and a gate driving circuit. The method for manufacturing the array substrate further includes: as shown in FIG. 14, the oxide conductive material 34 is filled in the third via hole 3321, and a driving circuit layer 35 is formed on the side of the protective layer 332 opposite away from the connecting circuit layer 31. The driving circuit layer 35 is for supplying a display signal and a timing control signal to the source driving circuit 41 and the gate driving circuit 42 through the oxide conductive material.

In one embodiment, the driving circuit includes a power supply circuit (Power IC), a timing control circuit (TCON IC), a gray scale circuit, and the like. The display signals provided by the driving circuit layer 35 to the source driving circuit 41 and the gate driving circuit 42 include: a data signal supplied by the driving circuit layer 35 to the source driving circuit 41; a scan signal supplied by the drive circuit layer 35 to the gate drive circuit 42.

Optionally, the oxide conductive material may be, for example, ITO.

Optionally, if the substrate 30 is a rigid substrate, after the driving circuit layer 35 is formed, the method for manufacturing the array substrate further includes: removing the array substrate from the base.

Optionally, if the substrate 30 is a flexible substrate, after the driving circuit layer 35 is formed, the method for manufacturing the array substrate further includes: peeling off the second carrier substrate.

In the embodiment of the present disclosure, since the oxide conductive material 34 is in contact with oxygen and water vapor, it will not be corroded. Therefore, the oxide conductive material is filled into the third via hole 3321 on the protective layer 332 such that the driving circuit layer 35 is electrically connected to the connecting circuit layer 331 through the oxide conductive material 34, thereby avoiding exposing the connecting circuit layer 331 directly to corrosion.

Optionally, as shown in FIG. 7, the orthographic projection of the first via hole 311 on the substrate 30 and the corresponding main via hole 301 are completely coincident. Alternatively, as shown in FIG. 8, the orthographic projection of the first via hole 311 on the substrate 30 completely covers the main via hole 301 corresponding thereto, and the area thereof is larger than the area of the cross section of the main via hole 301.

In one embodiment of the present disclosure, since the pixel circuit is not disposed in the area where the first via hole 311 is disposed in the pixel circuit layer 31, and when the first conductive material 302 is heated, it only expands in the thickness direction of the substrate. Therefore, when the first conductive material 302 is thermally expanded beyond the first surface of the substrate 30, the thermally expanded first conductive material 302 can be completely avoided from resulting in any one of the pixel circuit layers 31 being broken.

Optionally, filling the second conductive material 312 into the first via hole 311, comprising: filling the second conductive material 312 in the first via hole 311 by dispensing; alternatively; the second conductive material 312 is filled into the first via hole 311 by an electroless plating process.

Filling the third conductive material 334 in the second via hole 333, comprising: filling the third conductive material 334 in the second via hole 333 by dispensing; alternatively, the third conductive material 334 is filled into the second via 333 by an electroless plating process.

The material of the second conductive material 312 and the material of the third conductive material 334 may be the same or different.

When the second conductive material 312 is filled in the first via hole 311 by dispensing, or the third conductive material 334 is filled in the second via hole 333 by dispensing, the material of the second conductive material 312 and the material of the third conductive material 334 may be silver paste.

Wherein, the particle size of one drop of silver paste should be less than or equal to the size of the first via hole 311 and the second via hole 333, sot that the silver paste is prevented from being suspended in in the first via hole 311 or the second via hole 333 so as not to electrically connected to the first conductive material 302.

In the embodiment of the present disclosure, the second conductive material 312 may be filled in the first via hole 311 and the third conductive material 334 may be filled in the second via hole 333 by a dispensing or electroless plating process.

One embodiment of the present disclosure provides an array substrate. As shown in FIG. 5-8, the substrate 30 has a main via hole 301 disposed therein. The main via hole 301 is provided with a first conductive material 302. A pixel circuit layer 31 is disposed on the first surface of the substrate 30, and the pixel circuit layer 31 has a first via hole 311 corresponding to the main via hole 301. The orthographic projection of the first via hole 311 on the substrate 30 at least partially overlaps with the corresponding main via hole 301, and the first via hole 311 is filled with the second conductive material 312. The pixel circuit layer 312 includes a pixel circuit electrically connected to the first conductive material 302 through the second conductive material 312 disposed in the first via hole 311.

Alternatively, the substrate 30 may be a rigid substrate or a flexible substrate.

When the substrate 30 is a rigid substrate, the material thereof may be, for example, glass.

When the substrate 30 is a flexible substrate, the material thereof may be, for example, polyimide (PI).

The shape of the main via hole 301 is not limited. Alternatively, the shape of the main via hole 301 may be a circle, an ellipse, a rectangle, or the like.

The number of main via holes 301 is not limited, and the number of main via holes 301 is related to actual demand. Optionally, the number of the main via holes 301 may be one or plural.

The specific material of the first conductive material 302 is not limited.

Optionally, the first conductive material 302 includes a metal material such as Mo, Cu, MoNb, or Al; or the first conductive material 302 may also include an oxide conductive material such as ITO.

The installation position of the main via hole 301 is not limited, which is based on actual needs.

As shown in FIG. 3, the array substrate includes a display area 102 and a peripheral area 103 located at the periphery of the display area 102. Optionally, the main via hole 301 may be disposed in the display area 102 of the array substrate. Alternatively, the main via holes 301 may be provided in the peripheral region 103 of the array substrate.

Optionally, the pixel circuit layer comprises a pixel circuit and the pixel circuit comprises at least a switching transistor, a driving transistor connected to the light emitting component (including the OLED component or the LED), a storage capacitor, a data line for inputting a data signal to the switching transistor, and a gate line or the like for inputting a scan signal to the switching transistor.

It will be appreciated by those skilled in the art that the pixel circuit includes a plurality of conductive structures, a portion of the plurality of conductive structures being electrically connected to each other and a portion thereof being insulated from each other.

The second conductive material 312 in one embodiment of the present disclosure is electrically connected to the pixel circuit, and should ensure that the connection relationship of the plurality of conductive structures in the pixel circuit is not affected, thereby avoiding affecting the normal operation of the pixel circuit.

Optionally, the second conductive material 312 is electrically coupled to the gate lines or data lines in the pixel circuit.

Optionally, the pixel circuit layer 31 may further include a first voltage terminal that inputs the operating voltage VDD to the driving transistor and a second voltage terminal that inputs a ground voltage to the light emitting component. The first voltage terminal or the second voltage terminal is electrically connected to the second conductive material 312.

Here, the gate, the data line, the first voltage terminal, and the second voltage terminal are insulated from one another.

Alternatively, the switching transistor and the driving transistor may be any one of a top gate thin film transistor, a bottom gate thin film transistor, or a double gate thin film transistor.

Taking a top gate type thin film transistor as an example, as shown in FIG. 7, the top gate type thin film transistor includes an active layer 321, a gate insulating layer 322, a gate electrode 323, and an interlayer insulating layer 324 which are sequentially disposed on the substrate 30, and a drain 325 and a source 326 disposed on a side of the interlayer insulating layer 234 opposite from the substrate 30. The drain 325 and the source 326 are disposed in the sane layer.

The pixel circuit layer 31 includes a multilayer structure. When forming the first via hole 311, optionally, the first via hole 311 may be formed in the multilayer structure of the pixel circuit layer 31 by a mask; alternatively, a via hole is formed while forming each layer structure in the pixel circuit layer 31, and finally a plurality of via holes in the multilayer structure overlap to form the first via hole 311.

Optionally the orthogaphic projection of the first via hole 311 on the substrate 30 and the corresponding main via hole 301 at least partially overlap, including: the orthographic projection of the first via hole 311 on the substrate 30 coincides exactly with the corresponding main via hole 301; alternatively, the orthographic projection of the first via hole 311 on the substrate 30 covers the main via hole 301 corresponding thereto, and the area thereof is larger than the area of the cross section of the main via hole 301; alternatively, the main via hole 301 covers the orthographic projection of the first via hole 311 corresponding thereto on the substrate 30, and the area of the cross section of the main via hole 301 is larger than the area of the orthographic projection of the first via hole 311 on the substrate 30; alternatively, a portion of the orthographic projection of the first via hole 311 on the substrate 30 overlaps with a portion of the main via hole 301 corresponding thereto.

The shape of the orthographic projection of the first via hole 311 on the substrate 30 is not limited. Alternatively the shape of the orthographic projection of the first via hole 311 on the substrate 30 may be circular, elliptical, rectangular, or the like.

Here, the shape of the orthographic projection of the first via hole 311 on the substrate 30 may be the same as or different from the shape of the main via hole 301.

Optionally, the size of the first via hole 311 is not limited as long as the size of the first via hole 311 does not affect the normal operation of the pixel circuit in the pixel circuit layer 31.

For example, the first via hole 311 has a size ranging from about 50 μm to about 80 μm.

Wherein, herein the "size" refers to the largest size of the via hole. For example, if the shape of the orthographic projection of the first via hole 311 on the substrate 30 is circular, the diameter of the circle is about 50 μm to about 80 μm. If the shape of the orthographic projection of the first via hole 311 on the substrate 30 is elliptical, the major axis of the ellipse is about 50 μm to about 80 μm. If the shape of the orthographic projection of the first via hole 311 on the substrate 30 is a rectangle, the diagonal of the rectangle is about 50 μm to about 80 μm.

The specific material of the second conductive material 312 is not limited. Optionally, the second conductive material 312 may be silver paste, copper paste, solder paste or the like.

One embodiment of the present disclosure provides an array substrate. The first via hole 311 is disposed in the pixel circuit layer 31, and the orthographic projection of the first via hole 311 on the substrate 30 and the main via hole 301 on the substrate 30 at least partially overlap. In this way, the pixel circuit (for example, the data line and the gate line in the pixel circuit) in the pixel circuit layer 31 and the structure (for example, a subsequently formed connection circuit) disposed on the side of the substrate 30 opposite from the pixel circuit layer 31 may be vertically connected in the thickness direction of the substrate 30 by the first conductive material 302 filled in the main via hole 301. Compared with the related art, the space of the array substrate can be saved, and when the array substrate is applied to the display apparatus, the display apparatus (especially the splicing screen) is advantageously designed to have a narrow bezel. On this basis, since the area of the first via hole 311 is provided in the pixel circuit layer 31, the pixel circuit is not set. Therefore, in a region where the orthographic projection of the first via hole 311 on the substrate 30 coincides with the main via hole 301 even if the first conductive material 302 disposed in the main via hole 301 is thermally expanded and extends beyond the first surface of the substrate 30, any one layer of the pixel circuit layers 31 may not be broken. Meanwhile, since the second conductive material 312 is filled in the first via hole of the pixel circuit layer 31, the step of filling the second conductive material 312 is necessarily after the pixel circuit layer 31 is formed. Therefore, the second conductive material 312 can avoid all the high temperature processes in the process of preparing the pixel circuit layer 31, and is formed after the first conductive material 302 is thermally expanded by the high temperature process. Thereby, the second conductive material 312 can be prevented from broken during the thermal expansion process of the first conductive material 302.

Optionally, as shown in FIG. 9 and FIG. 10, a second surface opposite from the first surface of the substrate 30 is sequentially provided with a connecting circuit layer 331 and a protective layer 332 covering the connecting circuit layer 331. The connecting circuit layer 331 and the protection layer 332 have a second via hole 333 corresponding to the main via hole 301, and the second via hole 333 penetrates the connecting circuit layer 331 and the protection layer 334. The orthographic projection of the second via hole 333 on the substrate 30 and the corresponding main via hole 301 at least partially overlap. The second via hole 333 exposes a terminal located on a side of the connecting circuit layer 331, the second via hole 333 is filled with a third conductive material 334, and the terminals in the connection circuit layer 331 are electrically connected to the first conductive material 302 through the third conductive material 334.

Here, in a case where a GOA circuit is provided on the first surface of the array substrate, the connecting circuit layer 331 may include only the source driving circuit. Alternatively, the connecting circuit layer 331 may include a gate drive circuit and a source drive circuit.

Optionally, the orthographic projection of the second via hole 333 on the substrate 30 at least partially overlaps with the corresponding main via hole 301, including: the orthographic projection of the second via hole 333 on the substrate 30 exactly coincides with the corresponding main via hole 301; alternatively, the orthographic projection of the second via hole 333 on the substrate 30 covers the main via hole 301 corresponding thereto, and the area thereof is larger than the area of the cross section of the main via hole 301; alternatively, the main via hole 301 covers the orthographic projection of the second via hole 333 corresponding thereto on the substrate 30, and the area of the cross section of the main via hole 301 is larger than the area of the orthographic projection of the second via hole 333 on the substrate 30; alternatively, a portion of the orthographic projection of the second via hole 333 on the substrate 30 coincides with a portion of the main via hole 301 corresponding thereto.

It will be understood by those skilled in the art that in the case where the connecting circuit layer 331 includes a plurality of terminals, the timings of the signals output through the plurality of terminals or the output signals maybe different.

The third conductive material 334 in one embodiment of the present disclosure should be electrically connected to the terminal in the connecting circuit layer 331 while avoiding electrical connection among the plurality of terminals due to the third conductive material 334.

The shape of the orthographic projection of the second via hole 333 on the substrate 30 is not defined. Optionally, the shape of the orthographic projection of the second via hole 333 on the substrate 30 may be a circle, an ellipse, a rectangle, or the like.

Here, the shape of the orthographic projection of the second via hole 333 on the substrate 30 may be the same as or different from the shape of the main via hole 301.

Optionally, the size of the second via hole 333 is not limited.

For example, the second via hole 333 has a size ranging from 50 to 80 µm.

Wherein, the "size" herein refers to the largest size of the via hole. For example, if the shape of the orthographic projection of the second via hole 333 on the substrate 30 is circular, the diameter of the circle is about 50 µm to about 80 µm. If the shape of the orthographic projection of the second via hole 333 on the substrate 30 is elliptical, the major axis of the ellipse is about 50 µm to about 80 µm. If the shape of the orthographic projection of the second via hole 333 on the substrate 30 is a rectangle, the diagonal of the rectangle is about 50 µm to about 80 µm.

Optionally, the material of the third conductive material 334 may be silver paste, copper paste, solder paste or the like.

In one embodiment of the present disclosure, the connecting circuit layer 331 and the protective layer 332 are formed on the second surface of the substrate 30, and the connecting circuit layer 331 and the protective layer 332 have a second via hole 333 extending there through, and the second via hole 333 exposes the terminals located on the side of the connecting circuit layer 331. The third conductive material 334 is subsequently tilled in the second via hole 333 so that the terminals in the connecting circuit layer 331 exposed through the second via hole 333 is electrically connected to the pixel circuit in the pixel circuit layer 31 disposed on the first surface, thereby, the pixel circuit layer 31 is driven to operate by the connecting circuit layer 331. Meanwhile, since the connecting circuit layer 331 includes a metal wire or the like, the metal material of the metal wire is easily oxidized. Therefore, the protective layer 332 covering the connecting circuit layer 331 may be disposed on the side of the connecting circuit layer 331 opposite from the substrate 30 to protect the connecting circuit layer 331.

Optionally, as shown in FIG. 12, the main via hole 301 is located in the peripheral area 103, the connecting circuit layer 331 is located at least in the display area 102. The connecting circuit layer 331 includes a source drive circuit 41 and a gate drive circuit 42. Here, the light emitting components disposed on the first surface of the array substrate may be a top light emission type.

For example, taking the connecting circuit layer 331 including the source drive circuit 41 as an example, the pixel circuit layer 31 includes 1000 data lines, each of which is electrically connected to the sources 326 of the 500 switching transistors. Wherein, as shown in FIG. 8 to FIG. 10, the 500 switching transistors (FIGS. 8-10 show only two switching transistors) connected to the same data line 313 are electrically coupled to the second conductive material 312, the first conductive material 302, the third conductive material 334, and the source drive circuit through the same data line 313.

Figure 11:
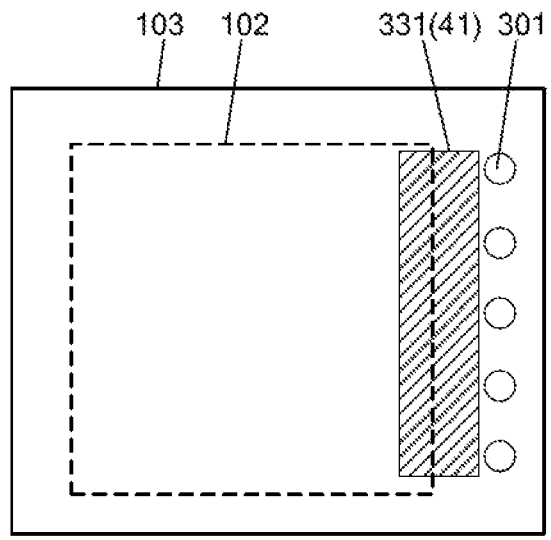
FIG. 11 is a schematic top view of a display apparatus according to an embodiment of the present disclosure.

Alternatively, as shown in FIG. 11, the connecting circuit layer 331 is disposed in the display area 102 and the peripheral area 103. Alternatively, as shown in FIG. 12, the connecting circuit layer 331 is provided only in the display area 102.

In one embodiment of the present disclosure, compared with the prior art wherein the source driving circuit 41 and the gate driving circuit 42 are all disposed in the peripheral region 103, by providing the connecting circuit layer 331 at least in the display area 102, the area of the peripheral area can be reduced. When the array substrate is applied to a display apparatus, it is advantageous for the display apparatus (especially the splicing screen) to perform a narrow bezel design.

In addition, as shown in E1G. 11, in the case where the GOA circuit is disposed on the first surface of the array substrate, the connecting circuit layer 331 may include only the source driving circuit 41, and the source driving circuit 41 is located at least in the display region 102.

Compared with the prior art wherein the source driving circuit 41 is entirely disposed in the peripheral region 103, the area of the peripheral region in one embodiment of the present disclosure can be reduced. When the array substrate is applied to a display apparatus, it is advantageous for the display apparatus (especially the splicing screen) to perform a narrow bezel design.

Optionally, as shown in FIG. 13 and FIG. 14, the protective layer 332 further has a third via hole 3321, and the orthographic projection of the third via hole 3321 on the substrate 30 at least partially overlap with the orthographic projection of the connecting circuit layer 331 on the substrate 30; and the third via hole 3321 is filled with an oxide conductive material 34. The array substrate further includes a driving circuit layer 35 disposed on a side of the protective layer 332 opposite from the connecting circuit layer 331, and the driving circuit layer 35 is for supplying a display signal and a timing control signal to the source driving circuit 41 and the gate driving circuit 42 through the oxide conductive material 34.

Here, the driving circuit includes a Power IC, a TCO IC, a gray scale circuit, and the like. The display signals supplied from the driving circuit layer 35 to the source driving circuit 41 and the gate driving circuit 42 include a data signal supplied by the driving circuit layer 35 to the source driving circuit 41 and a scanning signal by the driving circuit layer 35 to the gate driving circuit 42.

Alternatively, the oxide conductive material may be, for example, ITO.

In one embodiment of the present disclosure, since the oxide conductive material 34 is in contact with oxygen and water vapor, it will not be corroded. Therefore, the oxide conductive material is filled in the third via hole 3321 on the protective layer 332 so that the driving circuit layer 35 is electrically connected to the connecting circuit layer 331 through the oxide conductive material 34, thereby avoiding direct exposure of the connecting circuit layer 331 and corrosion.

Optionally, as shown in FIG. 7, the orthographic projection of the first via hole 311 on the substrate 10 and the corresponding main via hole 301 are completely coincident; Alternatively, as shown in FIG. 8, the orthographic protection of the first via hole 311 on the substrate 30 completely covers the main via hole 301 corresponding thereto, and the area thereof is larger than the area of the cross section of the main via hole.

In one embodiment of the present disclosure, since the pixel of the first via hole 311 is disposed in the pixel circuit layer 31, the pixel circuit is not disposed, and when the first conductive material 302 is heated, it only expands in the thickness direction of the substrate. Therefore, when the first conductive material 302 is thermally expanded beyond the first surface of the substrate 30, the thermally expanded first conductive material 302 can be completely avoided from resulting in any one of the pixel circuit layers 31 being broken.

One embodiment of the present disclosure further provides a display apparatus comprising the array substrate according to any of the preceding embodiments.

For the purpose and type of the display apparatus, reference may be made to the foregoing, and details are not described herein again.

The embodiment of the disclosure provides a display apparatus having the same technical effects as the array substrate described above, and details are not described herein again.

The above description is only a specific embodiment of the present disclosure, but the scope of protection of the present disclosure is not limited thereto. Any changes or substitutions that may be readily conceived within the scope of the present disclosure are intended to be included within the scope of the present disclosure. Therefore, the scope of the disclosure should be determined by the scope of the appended claims.

The principles and the embodiments of the present disclosure are set forth in the specification. The description of the embodiments of the present disclosure is only configured to help in understanding the method of the present disclosure and the core ideas thereof. Meanwhile, for a person of ordinary skill in the art, the disclosure relates to the scope of the present disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A method of manufacturing an array substrate, comprising:
   forming a main via hole in a substrate, and filling a first conductive material in the main via hole;
   forming a pixel circuit layer on a first surface of the substrate;
   forming a first via hole in the pixel circuit layer to expose the first conductive material in the main via hole, wherein an orthographic projection of the first via hole on the substrate at least partially overlaps the corresponding main via hole; and
   filling a second conductive material in the first via hole to connect to the first conductive material, the second conductive material being electrically connected to a pixel circuit;
   wherein the pixel circuit layer comprises the first via hole and the pixel circuit.

2. The method of manufacturing an array substrate according to claim 1, further comprising:
   forming a connecting circuit layer and a protection layer covering the connecting circuit layer on a second surface of the substrate opposite from the first surface;
   forming a second via hole to penetrate through the connecting circuit layer and the protective layer and expose a terminal located on a side of the connecting circuit layer, the connecting circuit layer and the protective layer comprising the second via hole corresponding to the main via hole, and an orthographic projection of the second via hole on the substrate at least partially overlapping the corresponding main via hole.

3. The method of manufacturing an array substrate according to claim 2, further comprising:
   filling a third conductive material in the second via hole, wherein the third conductive material is electrically connected to the connecting circuit layer through the terminal on the side of the connecting circuit layer.

4. The method of manufacturing an array substrate according to claim 3, further comprising:
   forming a third via hole in the protective layer, wherein an orthographic projection of the third via hole on the substrate at least partially overlaps an orthographic projection of the connecting circuit layer on the substrate.

5. The method of manufacturing an array substrate according to claim 4,
the connecting circuit layer including a source driving circuit and a gate driving circuit;
the method further comprising:
filling an oxide conductive material in the third via hole, and
forming a driving circuit layer on a side of the protective layer opposite from the connecting circuit layer,
wherein the driving circuit layer is configured to provide a display signal and a timing control signal to the source driving circuit and the gate driving circuit through the oxide conductive material, respectively.

6. The method of manufacturing an array substrate according to claim 1, wherein the orthographic projection of the first via hole on the substrate completely coincides with the corresponding main via hole; or
the orthographic projection of the first via hole on the substrate completely covers the corresponding main via hole, and an area of the orthographic projection of the first via hole on the substrate is larger than an area of a cross section of the main via hole; or
the corresponding main via hole completely covers the orthographic projection of the first via hole on the substrate, and the area of a cross section of the main via hole is larger than the area of the orthographic projection of the first via hole on the substrate.

7. The method of manufacturing an array substrate according to claim 1, wherein the first via hole is formed in a multilayer structure of the pixel circuit layer through a mask; or, the first via hole is formed while forming each layer structure in the pixel circuit layer, and finally a plurality of via holes in the multilayer structure overlap to form the first via hole.

8. The method of manufacturing an array substrate according to claim 5, wherein the second conductive material is filled in the first via hole by a dispensing or electroless plating process, and the third conductive material is filled in the second via hole by a dispensing or electroless plating process.

9. An array substrate, comprising:
a substrate, comprising a main via hole, the main via hole filled with a first conductive material;
a pixel circuit layer on a first surface of the substrate, the pixel circuit layer comprising a first via hole corresponding to the main via hole, an orthographic projection of the first via hole on the substrate at least partially overlapping the corresponding main via hole, and the first via hole filled with a second conductive material;
wherein the pixel circuit layer comprises a pixel circuit electrically connected to the first conductive material through the second conductive material in the first via hole.
wherein the array substrate further comprises a connecting circuit layer and a protective layer covering the connecting circuit layer on a second surface opposite from the first surface of the substrate; the connecting circuit layer and the protective layer comprising a second via hole corresponding to the main via hole, the second via hole penetrating through the connecting circuit layer and the protective layer, and an orthographic projection of the second via hole on the substrate at least partially overlapping the corresponding main via hole;
wherein the second via hole exposes a terminal on a side of the connecting circuit layer, and the second via hole is filled with a third conductive material, and the terminal on the side of the connecting circuit layer is electrically connected to the first conductive material through the third conductive material.

10. The array substrate according to claim 9, wherein the array substrate comprises a display area and a peripheral area at a periphery of the display area;
the main via hole is located in the peripheral area, and the connecting circuit layer is located at least partially in the display area.

11. The array substrate according to claim 10, wherein the protective layer further comprises a third via hole, an orthographic projection of the third via hole on the substrate at least partially overlaps an orthographic projection of the connecting circuit layer on the substrate; and
the third via hole is filled with an oxide conductive material.

12. The array substrate according to claim 11, further comprising:
a driving circuit layer on a side of the protective layer opposite from the connecting circuit layer,
wherein the driving circuit layer is configured to provide a display signal and a timing control signal to a source driving circuit and a gate driving circuit in the connecting circuit layer through the oxide conductive material, respectively.

13. The array substrate according to claim 9, wherein an orthographic projection of the first via hole on the substrate completely coincides with the corresponding main via hole; or
the orthographic projection of the first via hole on the substrate completely covers the corresponding main via hole , and an area of the orthographic projection of the first via hole on the substrate is larger than an area of a cross section of the main via hole; or
the corresponding main via hole completely covers the orthographic projection of the first via hole on the substrate, and the area of a cross section of the main via hole is larger than the area of the orthographic projection of the first via hole on the substrate.

14. The array substrate according to claim 9, wherein the first conductive material comprises molybdenum, copper, molybdenum-niobium alloy, aluminum; or Indium tin oxide.

15. The array substrate according to claim 9, wherein the second conductive material and the third conductive material each are one of silver paste, copper paste or solder paste.

16. The array substrate according to claim 9, wherein the substrate is a rigid substrate or a flexible substrate.

17. A display panel comprising the array substrate according to claim 9.

18. A display apparatus comprising the display panel of claim 17.

* * * * *